United States Patent
Tsao et al.

(10) Patent No.: US 12,265,411 B2
(45) Date of Patent: Apr. 1, 2025

(54) LOW-DROPOUT (LDO) VOLTAGE REGULATOR INCLUDING AMPLIFIER AND POWER DOWN CONTROL UNIT (PDCTRL)

(71) Applicant: Taiwan Semiconductor Manufacturing Company, Ltd., Hsinchu (TW)

(72) Inventors: Szu-Chun Tsao, Hsinchu (TW); Yi-Wen Chen, Hsinchu (TW); Jaw-Juinn Horng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/410,523

(22) Filed: Jan. 11, 2024

(65) Prior Publication Data

US 2024/0143008 A1 May 2, 2024

Related U.S. Application Data

(63) Continuation of application No. 17/456,934, filed on Nov. 30, 2021, now Pat. No. 11,906,997.

(60) Provisional application No. 63/188,992, filed on May 14, 2021.

(51) Int. Cl.
 *G05F 1/575* (2006.01)
 *G05F 1/565* (2006.01)
 *H03K 19/0185* (2006.01)

(52) U.S. Cl.
 CPC ............. *G05F 1/575* (2013.01); *G05F 1/565* (2013.01); *H03K 19/018521* (2013.01)

(58) Field of Classification Search
 CPC .......... G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735
 See application file for complete search history.

(56) References Cited

U.S. PATENT DOCUMENTS

| | | |
|---|---|---|
| 5,744,944 A | 4/1998 | Danstrom |
| 6,433,637 B1 | 8/2002 | Sauer |
| 6,552,599 B1 * | 4/2003 | Xu ........................ G05F 3/16 327/493 |
| 6,703,813 B1 | 3/2004 | Madislav et al. |
| 7,652,455 B2 | 1/2010 | Demolli |
| 7,952,397 B2 * | 5/2011 | Raghavan ...... H03K 19/018521 326/82 |
| 7,973,521 B2 * | 7/2011 | Chen ..................... G05F 1/56 323/273 |
| 8,324,876 B1 | 12/2012 | Le et al. |
| 8,970,188 B2 | 3/2015 | Ganta |

(Continued)

*Primary Examiner* — Sean Kayes
*Assistant Examiner* — Nusrat Quddus
(74) *Attorney, Agent, or Firm* — Merchant & Gould P.C.

(57) ABSTRACT

A middle-range (mid) low dropout (LDO) voltage has both sinking and sourcing current capability. The mid LDO can provide a voltage reference in active mode and power mode for core only design to work in a Safe Operating Area (SOA). The output of mid LDO can track IO power and/or core power dynamically. The mid LDO can comprise a voltage reference generator and a power-down controller connected to an amplifier, which output is connected to a decoupling capacitor. The provision of a high ground signal allows the mid LDO provide the sinking and sourcing currents.

20 Claims, 10 Drawing Sheets

(56) References Cited

U.S. PATENT DOCUMENTS

| | | | |
|---|---|---|---|
| 9,419,562 B1* | 8/2016 | Melanson | H03M 3/424 |
| 9,588,531 B2 | 3/2017 | Pelicia et al. | |
| 9,710,003 B2 | 7/2017 | El-Nozahi et al. | |
| 9,857,816 B2* | 1/2018 | Bhattad | H02M 1/32 |
| 10,152,072 B1* | 12/2018 | Elhebeary | G05F 1/468 |
| 10,768,650 B1 | 9/2020 | Huang | |
| 10,996,697 B2 | 5/2021 | Ates | |
| 10,996,700 B1 | 5/2021 | Tan | |
| 11,036,247 B1 | 6/2021 | Wei | |
| 11,906,997 B2 | 2/2024 | Tsao et al. | |
| 11,936,371 B1* | 3/2024 | Vangara | H03K 5/086 |
| 2003/0111985 A1* | 6/2003 | Xi | G05F 1/575 |
| | | | 323/273 |
| 2003/0218450 A1 | 11/2003 | Bonte | |
| 2007/0296388 A1* | 12/2007 | Sasaki | H02M 1/32 |
| | | | 323/288 |
| 2008/0089141 A1 | 4/2008 | Nandi | |
| 2009/0115379 A1* | 5/2009 | Al-Shyoukh | G05F 1/56 |
| | | | 323/238 |
| 2009/0289610 A1 | 11/2009 | Mandal | |
| 2009/0295466 A1* | 12/2009 | Truong | G05F 3/247 |
| | | | 327/543 |
| 2010/0156362 A1 | 6/2010 | Xie | |
| 2010/0164289 A1 | 7/2010 | Umminger et al. | |
| 2010/0164451 A1 | 7/2010 | Cerchi et al. | |
| 2011/0181257 A1 | 7/2011 | Pancholi et al. | |
| 2012/0187930 A1 | 7/2012 | Williams et al. | |
| 2012/0194151 A1 | 8/2012 | Gunther et al. | |
| 2012/0261994 A1 | 10/2012 | Nikolov et al. | |
| 2013/0093474 A1 | 4/2013 | Yang et al. | |
| 2014/0015509 A1 | 1/2014 | Gupta et al. | |
| 2014/0132349 A1* | 5/2014 | Park | H03F 3/3028 |
| | | | 330/267 |
| 2014/0140146 A1 | 5/2014 | Mozak et al. | |
| 2014/0184363 A1 | 7/2014 | Jou et al. | |
| 2014/0253089 A1 | 9/2014 | Qin | |
| 2014/0292301 A1 | 10/2014 | Lee et al. | |
| 2014/0300413 A1 | 10/2014 | Hoyerby et al. | |
| 2014/0347078 A1* | 11/2014 | Qin | G01R 19/0092 |
| | | | 324/713 |
| 2015/0115918 A1 | 4/2015 | Oikarinen | |
| 2015/0130427 A1 | 5/2015 | Chou et al. | |
| 2015/0227146 A1 | 8/2015 | Knoedgen et al. | |
| 2015/0362936 A1 | 12/2015 | Patel et al. | |
| 2016/0173066 A1 | 6/2016 | Yang et al. | |
| 2017/0033748 A1* | 2/2017 | Rajendran | H03F 3/245 |
| 2017/0301675 A1 | 10/2017 | Harjani et al. | |
| 2018/0046211 A1 | 2/2018 | Vilas Boas et al. | |
| 2018/0074536 A1 | 3/2018 | Xu et al. | |
| 2018/0095489 A1 | 4/2018 | Fang et al. | |
| 2019/0041885 A1 | 2/2019 | Hu et al. | |
| 2020/0081467 A1 | 3/2020 | Hu et al. | |
| 2020/0241584 A1* | 7/2020 | Kotrc | G05F 1/565 |
| 2021/0096586 A1 | 4/2021 | Lin et al. | |
| 2021/0126594 A1 | 4/2021 | Lambrecht et al. | |
| 2021/0240212 A1 | 8/2021 | Kimura | |
| 2021/0320671 A1 | 10/2021 | Tukel | |
| 2021/0333814 A1 | 10/2021 | Breslin | |
| 2022/0011798 A1 | 1/2022 | Matyscak | |
| 2022/0147081 A1* | 5/2022 | Wang | H04N 25/707 |
| 2022/0147082 A1 | 5/2022 | Melanson et al. | |
| 2022/0276666 A1 | 9/2022 | Wu et al. | |
| 2022/0308609 A1 | 9/2022 | Koay et al. | |
| 2022/0342434 A1 | 10/2022 | Meng et al. | |

* cited by examiner

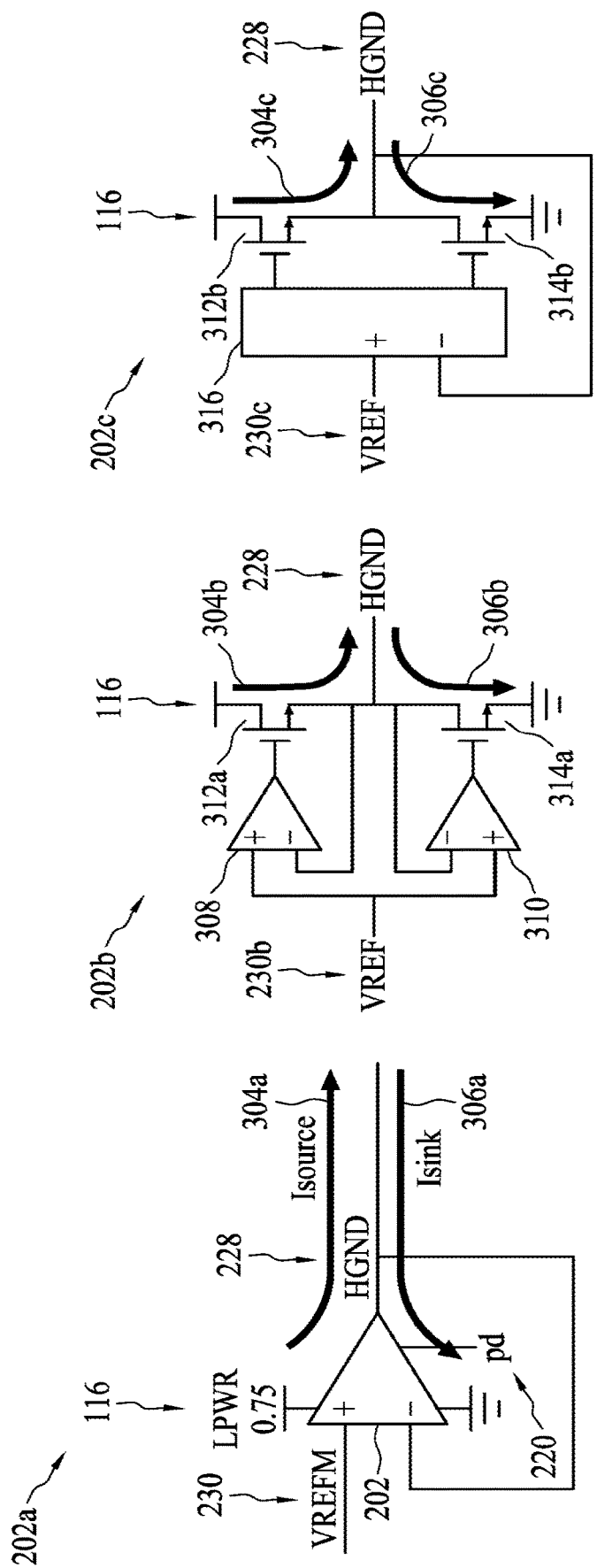

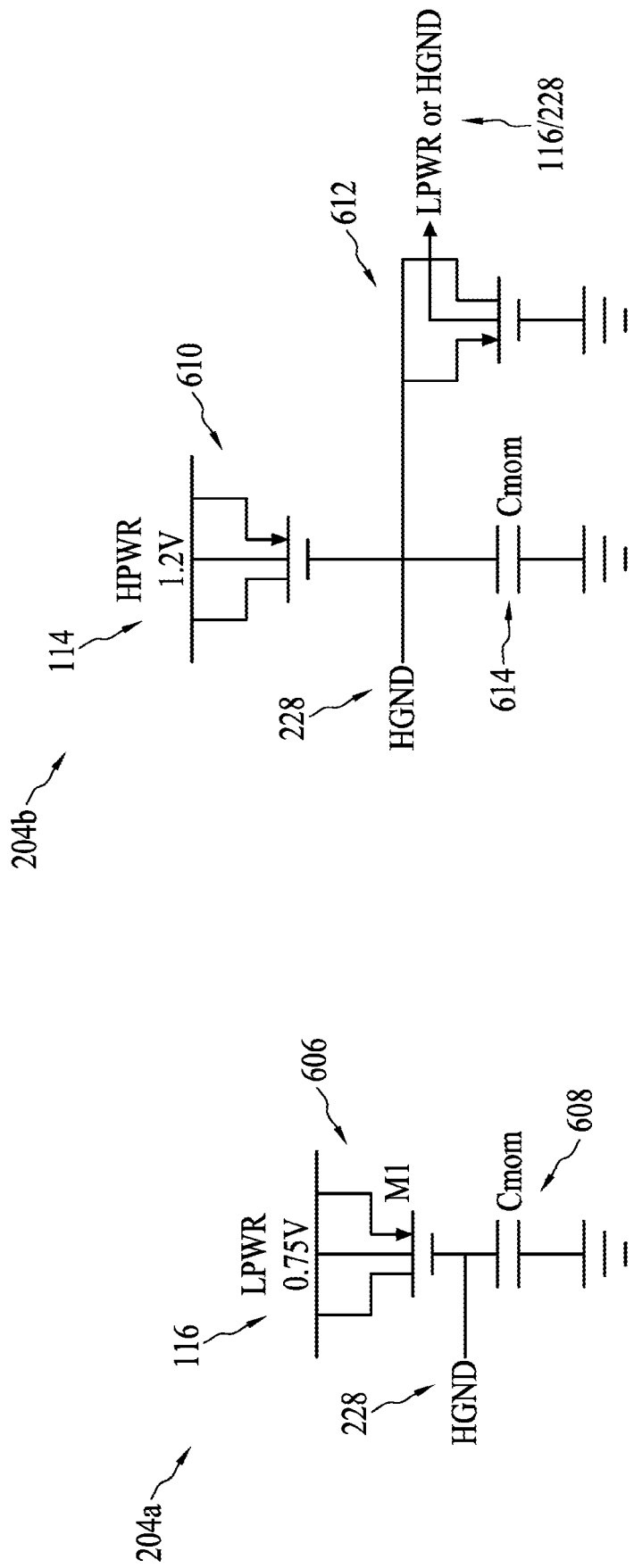

LOW-DROPOUT (LDO) VOLTAGE REGULATOR INCLUDING AMPLIFIER AND POWER DOWN CONTROL UNIT (PDCTRL)

CROSS-REFERENCE TO RELATED APPLICATION

This application is a continuation of application Ser. No. 17/456,934, filed Nov. 30, 2021, which claims the benefit of U.S. Provisional Patent Application No. 63/188,992, entitled "MID LDO FOR CORE ONLY DESIGN," filed on May 14, 2021, which applications are incorporated herein by reference in their entirety for all that it teaches and for all purposes.

BACKGROUND

Semiconductors can include core devices and input/output (IO) devices that perform different functions. These different devices can be constructed differently and require different voltage levels for input power. Further, these devices may have particular requirements for a Safe Operating Area (SOA) associated with the input voltages. For example, a core device may require 0.75V of input power with an acceptable stress level not to exceed 0.9V. Thus, the semiconductor often needs to shift the input voltage to the appropriate level for the type of device and then provide a stable input voltage within the acceptable SOA requirements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a circuit diagram illustrating aspects of an example amplifier in the LDO in accordance with examples of the present application.

FIG. 3B is another circuit diagram illustrating aspects of an example amplifier in the LDO in accordance with examples of the present application.

FIG. 3C is another circuit diagram illustrating aspects of an example amplifier in the LDO in accordance with examples of the present application.

FIG. 6A is a circuit diagram of an example decoupling capacitor device in accordance with examples of the present application.

FIG. 6B is a circuit diagram of another example decoupling capacitor device in accordance with examples of the present application.

DETAILED DESCRIPTION

Figure 1:
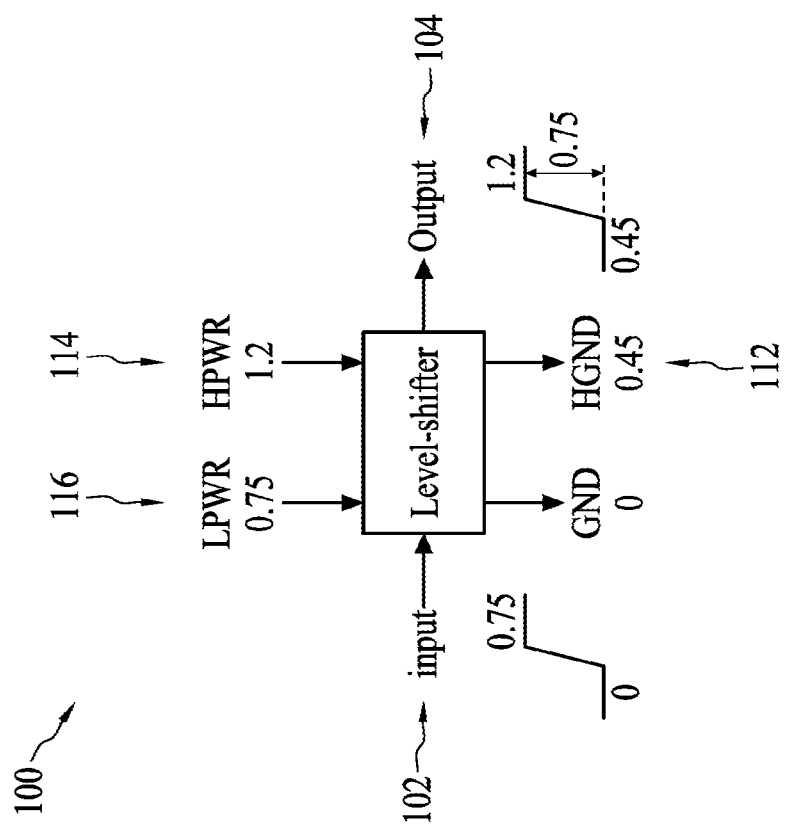
FIG. 1 is a block diagram illustrating aspects of an example voltage level shifter device in accordance with examples of the present application.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include examples in which the first and second features are formed in direct contact, and may also include examples in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various examples and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects herein provide a novel structure for a middle-range (mid) LDO voltage regulator (referred to simply as an LDO) with sinking and sourcing capability. The LDO can provide a voltage reference in active mode and power mode (also referred to as power-down (PD) mode) for core only design to work in a Safe Operating Area (SOA). The output of mid LDO can track IO power and/or core power dynamically. The "core" can be the central processing unit (CPU) of the semiconductor, also called a central processor, main processor or just processor. The core can be the electronic circuitry that executes instructions comprising a computer program, performs basic arithmetic, logic, controlling, and input/output (I/O) operations specified by the instructions in the program. The core can be separate circuitry from the components that comprise the main memory and IO circuitry. The IO circuitry can be any component that conducts communications between components internal to or external to the semiconductor.

Aspects herein provide several advantages. Without an external reference input in power-down mode, current methodology can still keep a voltage reference to ensure SOA of a circuit with core design only. Current variation in active mode can be kept low by current methodology. A high decoupling capacitor (CAP) density can be designed for area saving.

The design of the LDO can comprise an amplifier, a Voltage REFerence (VREF) GENerator (VREFGEN), a Power-Down Control Unit (PDCTRL), and/or a decoupling capacitor (CAP). The amplifier may be a low energy-consumed and well-biased Class A and Class B (AB) based amplifier. The VREFGEN can be a VREF for the LDO that can be from an external VREF or can automatically track IO Power (HPWR) and/or Core Power (LPWR). The PDCTRL can be a PDCTRL-defined High-side Ground Reference (HGND) in power-down mode (PD is active high) with low current consumption. The decoupling CAP can be a low-leakage and high-density decoupling CAP.

In implementations, the current flow in the LDO may occur at the amplifier and in the associated HGND used in the core-only application. A loading current can flow into HGND as an Isink current. In other situations, an Isource current, from HGND, to the load may occur to maintain the voltage reference when any noise coupling occurs. The structure of the LDO can provide enough Isource and Isink current. A conventional approach may use a Class-A amplifier design. To maintain the least energy, other structures can be used. The amplifier can dynamically control PMOS and NMOS at the same time with different loading requirements.

The amplifier, in the LDO, can include a class-AB based amplifier with good current control due to the bias control for cascode PMOS transistors and NMOS transistors operating near the rail voltage. Some of the transistors in the amplifier may form a diode-connected current-mirror to pass the differential signal into a signal ended summation. Further, the design can be enhanced to bias various transistors to separately control a Vpush and a Vpull well, which allows for better current control. To have core only operation in the IO power domain, the voltage difference can fall within core operation power. Thus, Vpp, under IO power, may be the same as core power, e.g., LPWR. In at least some implementations, maximum power is IO power and minimum power is IO power minus LPWR, or HGND.

The LDO can comprise a dynamic tracking for VREFM from LPWR and HPWR. The voltage subtraction is processed through a voltage to current transformation. Information about LPWR may be transferred to a current through diode-connected transistors. In some implementations, a current transfer back to voltage may also be provided. For good current matching, the PMOS threshold voltage (Vthp1) is the same or about the same as the second threshold voltage (Vthp2), e.g., Vthp1=~Vthp2. Then, Vx can be determined by solving HPWR-LPWR.

To keep a low operating current in power-down mode, the amplifier can be turned off. However, the HGND may still need to be maintained at the same level to keep the core device operating in the SOA. Thus, the LDO can include a PDCTRL circuit, which can comprise a resistive diode-connected device that can avoid the layout area and keep low variation with a sinking leakage.

The LDO can also include a decoupling CAPacitor (CAP). The CAP can allow for sinking and sourcing that may be required by the mid-LDO to filter high frequencies during loading transitions. As the CAP transitions from HGND to the ground, a metal-oxide-metal capacitor CMOM) can handle the large leakage. To keep a high CAP density, a P-type metal oxide semiconductor capacitor (MOSCAP), can be placed beneath the CMOM and placed between LPWR and HGND. The MOSCAP connection to LPWR can handle the lower leakage.

The implementations can have a highest CAP density solution. A core PMOSCAP can be implemented in the SOA, the CAP density can be improved by over 40% due to Capacitance-Voltage (CV) curve shifting. To improve the CAP density from HGND to ground, another PMOSCAP can be applied, with the gate connected to ground, to turn on the channel and make the CAP size larger. The body of another transistor can be connected to LPWR, to avoid extra guard-ring space when the transistor is connected to drain/source as the hot-well. Also, the transistor can be connected to HGND, to reduce the leakage between a diffusion (drain/source) to a n-well. The CMOM can be above a MOSCAP to optimize the layout area. Further, by changing the body connected to LPWR or HGND, the CAP density can be increased, and the total area can be decreased.

An example of a novel level shifter 100 may be as shown in FIG. 1. The level shifter 100, in FIG. 1, may be operable to provide a voltage reference for IO devices and for core devices within a semiconductor device. The level shifter 100 may receive an input 102, which may trigger and output 104. The level shifter 100 may be connected to both a low power voltage (LPWR) 116 and a high-power voltage (HPWR) 114. In at least some implementations, the LPWR is 0.75V, or the core voltage, and the HPWR is 1.2V, or the IO voltage. The level shifter 100 may also be connected to low ground, which may be at 0V, and to a high ground (HGND), which may be 0.45V. With the HGND 112, the level shifter 100 may output a voltage reference 104 that may track the difference between HPWR 116 and the HGND 112. Thus, the output 104 from the level shifter 100 can be 0.75 V. The level shifter 100 may be operable to provide an output voltage to core devices and/or to IO devices. Further, unlike previous designs, the HGND input 112 to the level shifter 100 is stable in various modes.

The level shifter 100 may function to provide a voltage to at least the core design as an advanced node. The level shifter 100 can function in the HPWR domain but can still avoid overstressing the core design with the HPWR input of 1.2V, which is beyond the SOA of core design. The SOA is maintained by the level shifter 100 either in PD mode or active mode. The level shifter 100 includes one or more of the novel components described hereinafter, including the LDO and/or one or more the LDO's novel components described hereinafter.

In implementations, the reference bias voltage output 104 may be built up through an LDO, which can compensate for current variations in the load with both the sinking and sourcing currents. The LDO can establish a voltage reference either as a fixed input level or as the difference between core power and IO power. To ensure these functions, the level shifter 100 may receive a HGND voltage reference 112 that can help prevent over stressing the core design by acting as a sinking reference. Thus, the implementations herein allow for core operation with a Vpp of 1.2V with the inclusion of the HGND 112. The HGND 112 can function as a lowest rail reference with a sinking capability although the HGND 112 may not be supported by an external pin.

Figure 2:
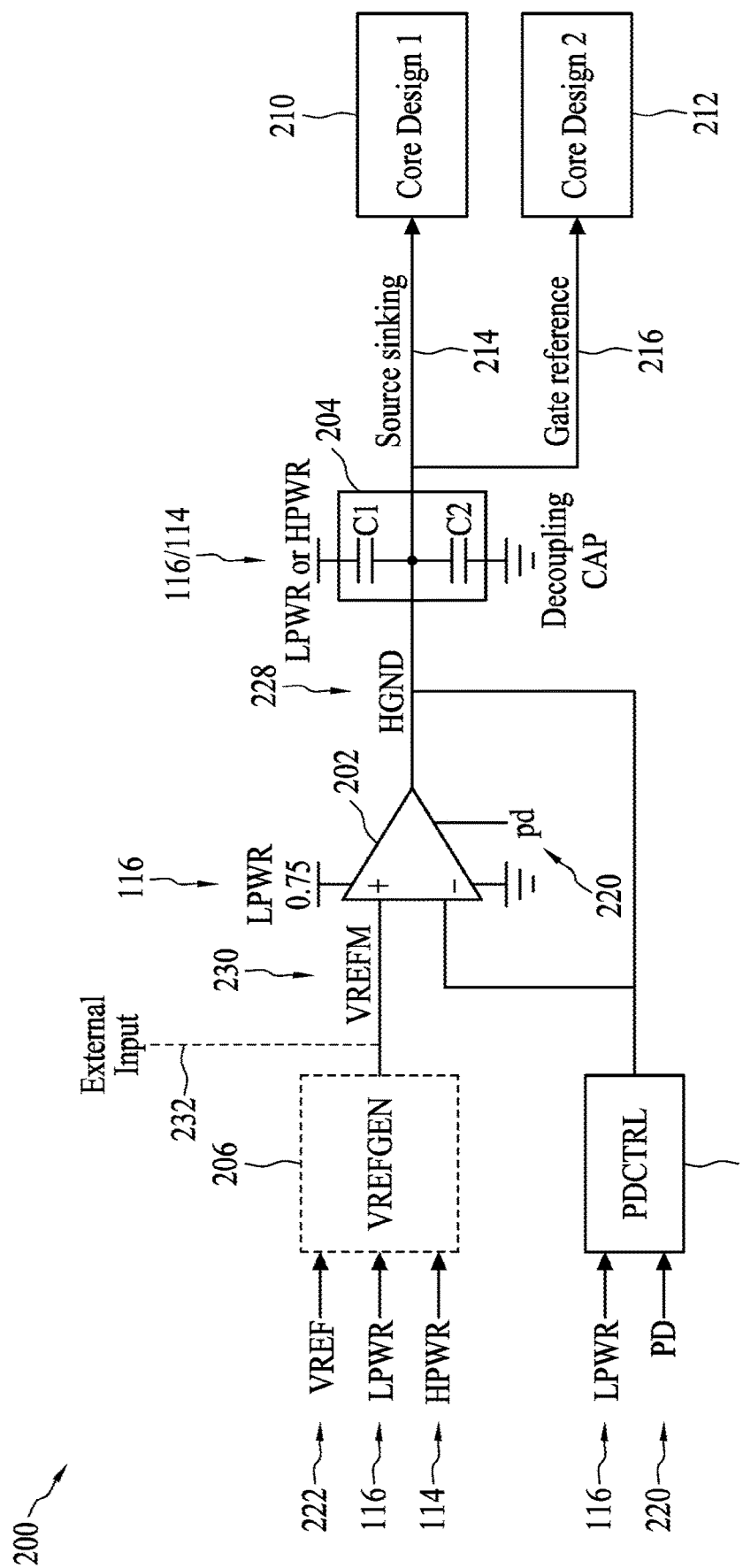
FIG. 2 is a circuit diagram illustrating aspects of the example Low Dropout (LDO) voltage regulator in accordance with examples of the present application.

An implementation of a midrange LDO 200 may be as shown in FIG. 2. A LDO can be a direct current (DC) linear voltage regulator that regulates an output voltage 214, 216 even when the supply voltage 230 is very close (for example, ±0.5V, 0.6V, 0.7V, etc.) to the output voltage 214, 216. The LDO 200 can include one or more of, but is not limited to, an amplifier 202 connected to a decoupling capacitor 204 and receiving inputs from a VREFGEN 206 (or an external input 232) and a PDCTRL 208. The output of the amplifier 202 and the decoupling capacitor 204 provides a voltage reference 214, 216 to the core design 210 and/or 212, although the LDO 200 may operate in the HPWR domain.

The amplifier 202 may be a DC-coupled, high-gain electronic voltage amplifier with a differential input and a single-ended output. In at least some implementations, the amplifier 202 may be a low energy-consumed and well-biased AB based amplifier. The amplifier 202 may receive an input voltage reference 230, from the VREFGEN 206 or from an external input 232, as a first differential input and HGND 228 as a second differential input. The amplifier 202 may receive the HGND from the PDCTRL 208. The PDCTRL 208 may connect the HGND 228 to the single output of the amplifier 202 and the decoupling capacitor 204. This configuration allows the amplifier to produce a sourcing current or receive a sinking current based on the load configuration and operation. Example implementations of the amplifier 202 may be as provided in FIGS. 3A-3E.

Figure 4:
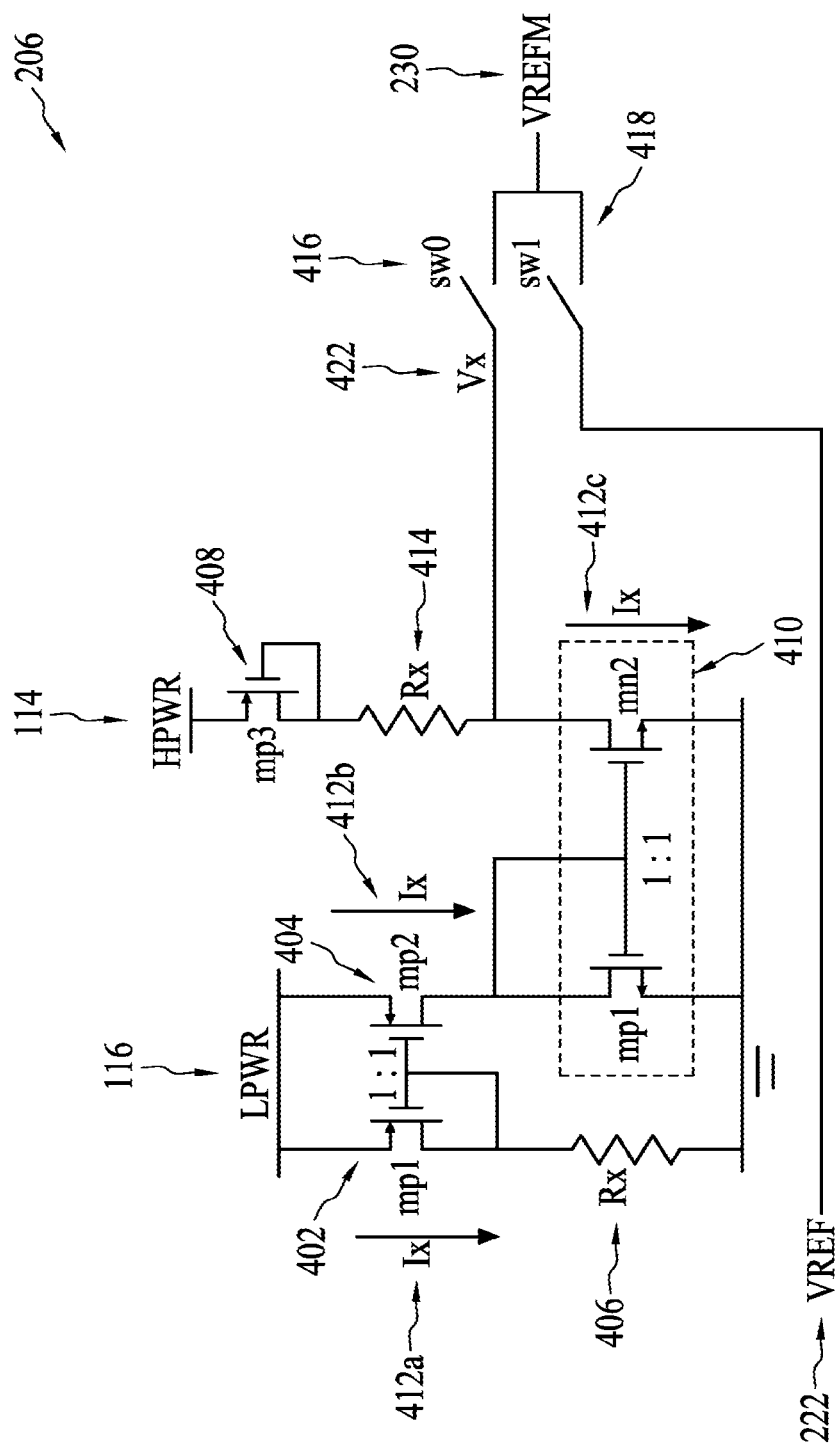
FIG. 4 is a circuit diagram illustrating aspects of an example voltage reference generator in accordance with examples of the present application.

The VREFGEN 206 may receive a voltage reference signal 222, the LPWR voltage 116, and/or the HPWR voltage 114. The VREFGEN can provide the VREFM signal 230 to the amplifier 202. The VREFGEN 206 can provide the VREFM signal 230 from an external VREF signal 222 or by automatically tracking the different between HPWR 114 and LPWR 116. An example of the VREFGEN circuit 206 may be as shown in FIG. 4. In other implementations, the input VREFM signal 230 may be supplied by an external input 232, provided as a voltage reference from other circuitry.

Figure 5:
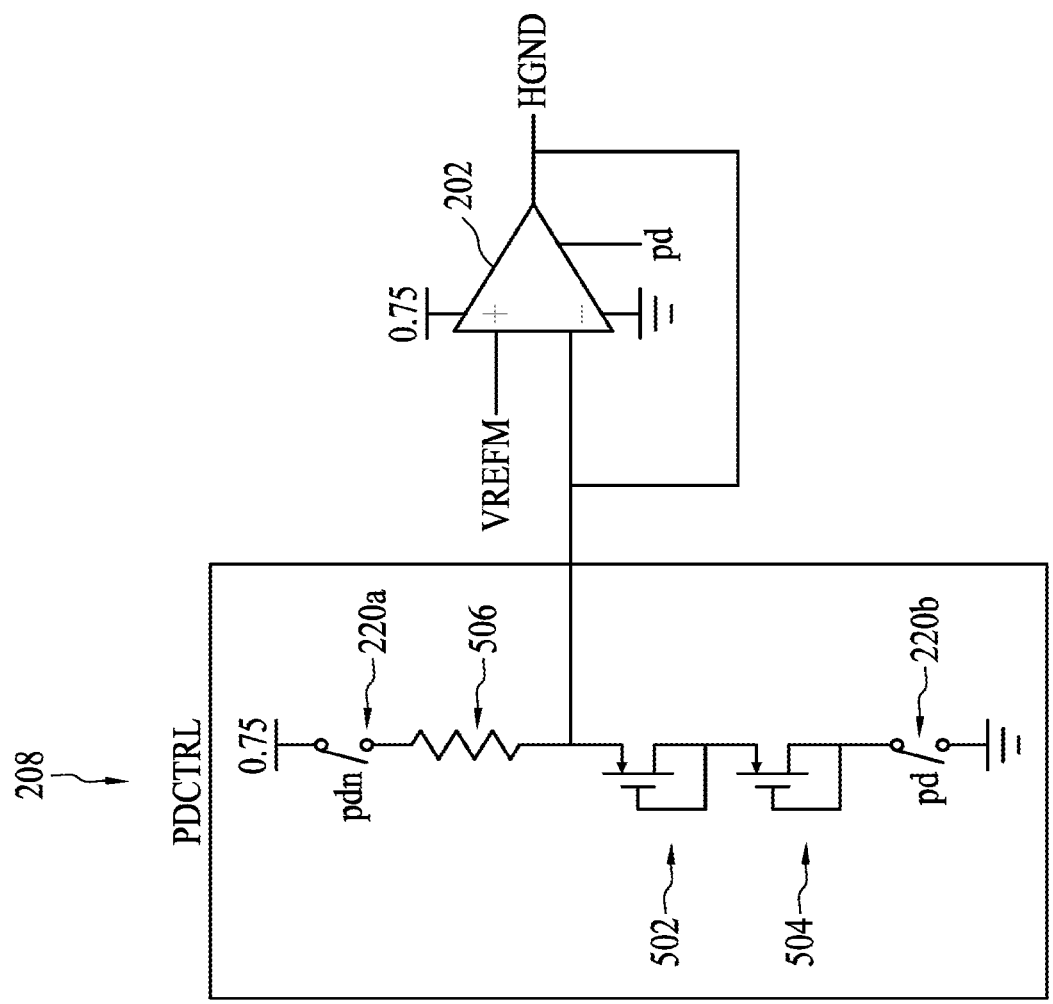
FIG. 5 is a circuit diagram of an example Power Down Control (PDCTRL) device in accordance with examples of the present application.

The PDCTRL 208 may receive the LPWR voltage 116 and a PD signal 220. The PDCTRL can provide the HGND voltage (for example, 0.45V) 228 to the differential input of the amplifier 202 and to the output of the amplifier 202. The PDCTRL 208 can provide the HGND 228 even in PD mode (for example, when PD 220 is active high). An example of the PDCTRL 208 may be as shown in FIG. 5.

The decoupling capacitor (CAP) 204 can decouple the HGND from the power sources, for example, the LPWR 116 or HPWR 114 signals. Further, the decoupling CAP 204 can also help provide the sourcing current or receive the sinking current based on the operation of the core design 210, 212. The decoupling CAP 204 may be low leakage and high-density. Implementations of the decoupling CAP 204 may be as shown in FIGS. 6A-7B.

Implementations of the LDO 200 can provide both the sinking and sourcing currents from/to the amplifier 202. Further, the LDO 200 can track either IO power or core power dynamically. As shown in FIG. 2, the inclusion of a high ground 228 at the output of the amplifier 202 can ensure that the core designs 210, 212 can operate in a SOA regardless of the whether the semiconductor device is in active mode or power down mode. Thus, the LDO 200 can maintain the voltage reference in various modes with a good SOA, even absence an input reference signal. Further, the LDO 200 provides low current variation. Finally, the decoupling capacitor 204 is designed to be high density to limit the amount of area in the semiconductor needed for the capacitor.

Implementations of the amplifier 202a-202e may be as shown in FIGS. 3A-3E. The amplifiers 202a through 202e can receive the voltage reference signal 230a-230c. Based on this voltage reference 230 and the high ground 228 at the output of the amplifier, the amplifier 202 can either provide a sourcing current 304a-304c or a sinking current 306a-306c. The amplifier 202 can be provided with LPWR 116 and the PD signal 220. The current 304a, 304b to/from HGND 228 may maintain the voltage reference when any noise coupling occurs.

A more detailed implementation of the amplifier 202b may be as shown in FIG. 3B. A first amplifier 308 is connected to the voltage reference with the output of the amplifier 308 connected to the gate of a P-type Metal-Oxide-Semiconductor Field Effect Transistor (PMOS) 312a. The drain of the PMOS 312a can be fed back to the inverting terminal of the amplifier 308. Further, the drain of the MOSFET 312a may also be connected to HGND 228. The source of the MOSFET 312a can also be connected to LPWR 116. The implementation of the amplifier 202b may comprise a Class-A amplifier design.

In contrast a second operational amplifier 310 can also be provided as shown in FIG. 3B. To use the least amount of energy, the amplifier 202c can be implemented. Again, the noninverting terminal of the amplifier 310 can be provided with the voltage reference 230b. Similarly, the inverting terminal of the amplifier 310 may be connected to the drain of the of N-type MOSFET (NMOS) 314a that may also be connected to the HGND 228. The output of the amplifier 310 is connected to the gate of the NMOS 314a and the source of the NMOS 314a can be connected to ground. In this way, if the voltage required by the load is greater than HGND 228, a sourcing current 304b may be fed through the PMOS 312a to the load. Further, if the voltage required by the load is below HGND 228, a sinking current 306b may be created from HGND 228. Thus, the designing the amplifier 202b can provide both the sourcing current 304b and the sinking current 306b.

Figure 3D:
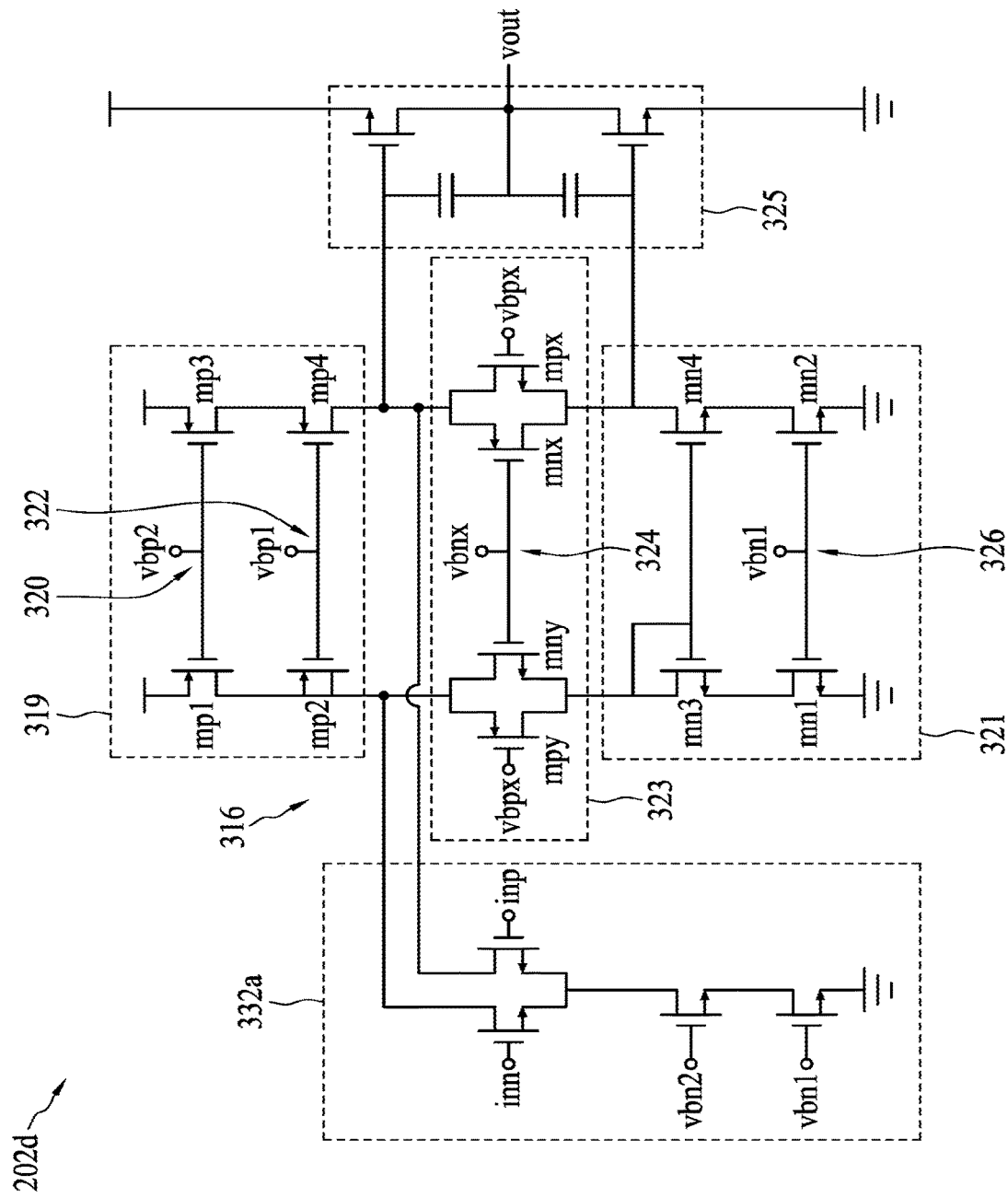
FIG. 3D is a circuit diagram illustrating aspects of an example folded-cascode class-AB based amplifier in accordance with examples of the present application.
Figure 3E:
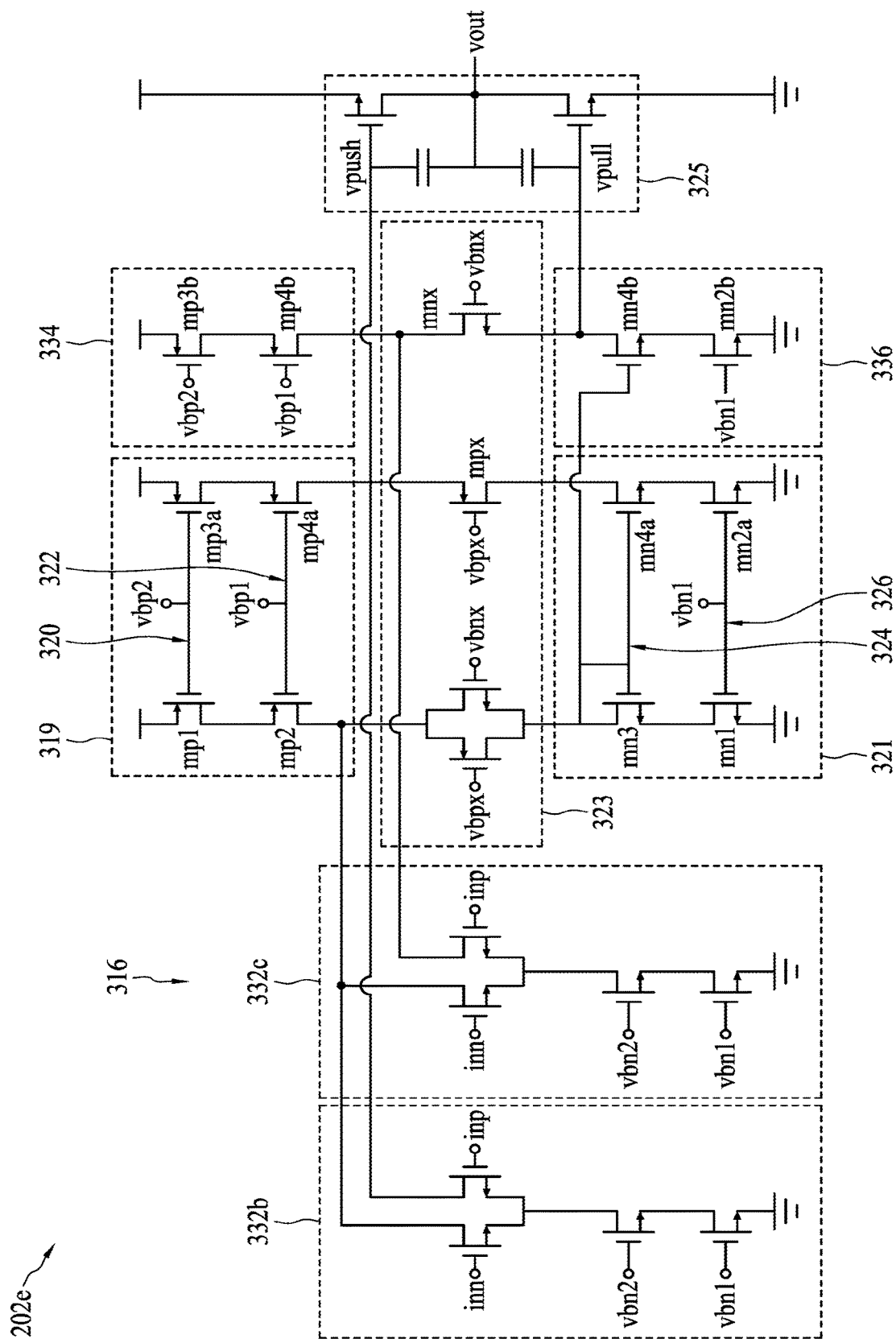
FIG. 3E is a circuit diagram illustrating aspects of another example folded-cascode class-AB based amplifier in accordance with examples of the present application

Another implementation of the amplifier 202c is provided in FIG. 3C. Rather than providing the two amplifiers 308 and 310, the amplifier 202c can comprise a single folded cascode amplifier 316 connected to the voltage reference 230c, with two outputs to the MOSFETs 312b and 314b. This amplifier 202c can also provide the sourcing current 304c and the sinking current 306c. Examples of the folded cascode amplifier 316 as implemented in FIG. 3C may be as shown in FIGS. 3D and 3E. The amplifiers 202a-202c can dynamically and concurrently control PMOS 312 and NMOS 314 with different loading requirement(s).

An implementation of a folded cascode amplifier 202d may be as shown in FIG. 3D. A folded cascode amplifier 202d may be a single-pole operational amplifier with large output swing and a higher gain. The amplifier 202d may be a class-AB based amplifier with good current control due to the bias control for cascode PMOS transistors (mp1-mp4), in area 319, and NMOS transistors (mn1-mn4), in area 321, operating near the rail voltage. Some of the transistors in the amplifier may form a diode-connected current-mirror, in area 323, to pass the differential signal, provided from area 332a-332c, into a signal ended summation, in area 325. Further, the design can be enhanced to bias various transistors to separately control a Vpush and a Vpull well (in area 325), which allows for better current control. To have core only operation in the IO power domain, the voltage difference can fall within core operation power. Thus, Vpp, under IO power, may be the same as core power, e.g., LPWR. In at least some implementations, maximum power is IO power and minimum power is IO power minus LPWR, or HGND.

A first set of PMOS transistors, in area 319, can be operable to supply a voltage input to the amplifier transistors in the current mirror 323. The control of the PMOS transistors in area 319 can include two biasing voltages 320 and 322. The two biasing voltages allow for better current control through the transistors mp1-mp4 in area 319. Similarly, the NMOS transistors 321 are connected to ground with control from biasing voltage 326. The NMOS transistors 321 may also have better current control due to the separate biasing voltage 326. The output transistors, in area 325, can be controlled by biasing voltages provided through input portion 332a.

The second implementation of the folded cascode amplifier 202e may be as shown in FIG. 3E. The amplifier 202e may be similar to the cascode amplifier 202d shown in FIG. 3D. The differences include a separate input branch 332c placed in parallel with input 332b to allow for better biasing of the Vpush and Vpull transistors in area 325. Further, the current mirror in area 323 is expanded to add transistor mnx. The separate input branch 332c also helps better bias the transistors mpx and mnx, in area 323. Another circuit of PMOS transistors, in area 334, are added to the PMOS transistors in area 319. Also, another branch of NMOS transistors, in area 336, is added to the NMOS transistors in area 321. These changes ensure lesser current variation and defines the current better through the amplifier 202e. Thus, the enhanced design of the amplifier 202e can bias mpx and mnx, in the current mirror 323, to separately can control the Vpush and Vpull wells in area 325.

An implementation of the VREFGEN 206 may be as shown in FIG. 4. VREFGEN 206 can dynamically track VREFM from LPWR and HPWR or from a supplied VREF signal. The voltage subtraction is processed through a voltage to current transformation. Information about LPWR 116 may be transferred to a current Ix 112 through diode-connected transistors 402, 404, 408, and 410. In some implementations, a current transfer back to voltage may also be provided. For good current matching, the PMOS threshold voltage (Vthp1) is the same or about the same as the second threshold voltage (Vthp2), e.g., Vthp1≈Vthp2. Then, Vx can be determined by solving HPWR-LPWR.

For example, the current Ix 412a is determined by the dividing the LPWR 116 by the resistance or voltage drop (Vthp1) across the transistor 402 and across the resistor 406. Likewise, the current 412c is determined by dividing HPWR 114 by the voltage drop (Vthp2) across the transistor 408 and across the resistor 414. These two currents are the same or nearly the same. Further, the voltage Vx 422 is determined by the voltage drop from HPWR 114 across transistor 408 and resistor 414. These equations are shown below:

$$Ix = LPWR - IxRx - Vthp1$$

$$Vx = HPWR - Vthp2 - IxRx$$

$$Vthp1 \approx Vthp2$$

Thus, based on above, Vx is equivalent to HPWR-LPWR. In an example, Vx is 1.2V-0.75V, which equals 0.45, the value of HGND.

The voltage reference generator may be supplied as shown in FIG. 2 with a LPWR signal 116, a HPWR signal 114. The LPWR signal 116 is provided to the NMOS transistors 402, 404. The LPWR signal 116 may produce a current 412a, 412b through the transistor 402 and resistor 406. The current 412 may be defined by the amount of resistance in the diode of transistor 402 and the resistor 406. The current 412a is matched by current 412b and/or current 412c. The current 412c from the HPWR source 114 is provided to another NMOS transistor 408 and resistor 414. As such that current change can help produce the output reference voltage reference 420. By adjusting the resistances 406 and 414 the voltage reference signal 420 may be adjusted.

The voltage reference Vx 422 can be supplied through switches 416, 418 as an output signal 230. Thus, the VREF signal 222 may be provided directly through closed switch 418. However, in other implementations, the VREF signal is Vx 422, which is determined by the difference between HPWR 114 and LPWR 116, as explained above.

In some implementations the voltage reference may be externally supplied as signal 422. This Vpp external voltage reference signal may be provided through switch 418 as signal 230. In other situations, the presence of low power high-power produces the voltage reference when switch 416 is closed. In this way the voltage reference generator can generate a signal from an outside voltage reference 422 or can dynamically track the difference between LPWR 116 and HPWR 114, through a network of transistors 402-410 and the resistors 406, 414. Thus, Vpp, under IO power, is the same as core power, e.g., LPWR. Further, maximum power for VREF is IO power, e.g. HPWR 116, and the minimum power is HPWR-LPWR.

An implementation of the PDCTRL 208 may be as shown in FIG. 5. To keep a low operating current in PD mode, the amplifier 202 can be turned off. However, the HGND may still need to be maintained at the same level to keep the core device operating in the SOA. Thus, the LDO 200 can include a PDCTRL circuit 208, which can comprise a resistive diode-connected device 502, 504, which can avoid the layout area and keep low variation with sinking leakage.

The PDCTRL 208 can be supplied by LPWR 116 through a switch 220a connected in series with the resistor 506 that has an output to the amplifier 202. Further, ground can be connected through another switch 220b and one or more PMOS transistors 502 and 504. These diode connected PMOS transistors 502, 504 have a set resistance when connected into the circuit. Further the PMOS transistors 502, 504 can limit current variations. When the voltage difference required to retrieve high ground is based on low power of 0.75 V, transistors 502, 504 may provide enough resistance to limit the voltage difference. If the high ground is a higher value than 0.45 V, more transistors may be needed within the circuit. When switch is pdn 220a and pd 220b are connected and closed, the output to the amplifier is based on the value of the resistor 506 and the resistance inherent in the diodes of transistors 502, 504. Thus, even when the amplifier is power down, the PDCTRL 208 can still supply HGND 228 such that the voltage to the core does not exceed the SOA.

Implementations of the decoupling CAP 204 may be as shown in FIGS. 6A-7B. The decoupling CAP 204s may be for core devices only. A LPWR signal 116 may be provided through transistor M1 606. High ground may be connected from the output of the amplifier 202 to the gate of transistor M1 606. Further, a Metal-Oxide-Metal (MOM) CAP (CMOM) 608 may also be connected between the gate of transistor M1 606 and ground. The decoupling CAP 204 ensures that low power 602 and high ground are decoupled and that, when the amplifier 202 is in PD mode, the decoupling CAP 204 can still provide the sourcing or sinking current. The device 204a may be used for core devices only.

Another implementation of the decoupling capacitor 204b may be as shown in FIG. 6B. HPWR 604 is provided through transistor 610. High ground may be connected from the output of the amplifier 202 to the gate of transistor 610. Further, a CMOM 614 may also be connected between the gate of transistor 610 and ground. Further, a PMOS transistor 612 is also connected from high ground to LWPR/HGND 116/228. The PMOS 612 acts as a PMOSCAP to decouple high ground from LWPR. The PMOSCAP 612 may be large enough to ensure that the voltage between the source and the ground is enough to decouple HGND 228 and LWPR 116. The transistor 612 also allows for the capacitor 614 to be configured in a stack-mount design making the CAP area density higher. The design of 204b can function to decouple core power at 0.75V under the IO domain.

The decoupling CAP 204b can allow for sinking and sourcing that may be required by the LDO 200 to filter high frequencies during loading transitions. As the decoupling CAP 204b transitions from HGND to the ground, the CMOM can handle the large leakage. To keep a high CAP density, a P-type metal oxide semiconductor capacitor (MOSCAP), can be placed beneath the CMOM and placed between LPWR and HGND. The MOSCAP connection to LPWR can handle the lower leakage.

The implementations can have a high CAP density solution. A core PMOSCAP can be implemented in the SOA, and the CAP density can be improved by over 40% due to Capacitance-Voltage (CV) curve shifting. To improve the CAP density from HGND to ground, another PMOSCAP 612 can be applied, with the gate connected to ground, to turn on the channel and make the CAP size larger. The body of another transistor 612 can be connected to LPWR, to avoid extra guard-ring space when the transistor is connected to drain/source as the hot-well. Also, the transistor 612 can be connected to HGND, to reduce the leakage between a diffusion (drain/source) to a n-well. The CMOM 614 can be above a MOSCAP 612 to optimize the layout area. Further, by changing the body connected to LPWR or HGND, the CAP density can be increased, and the total area can be decreased.

Figure 7B:
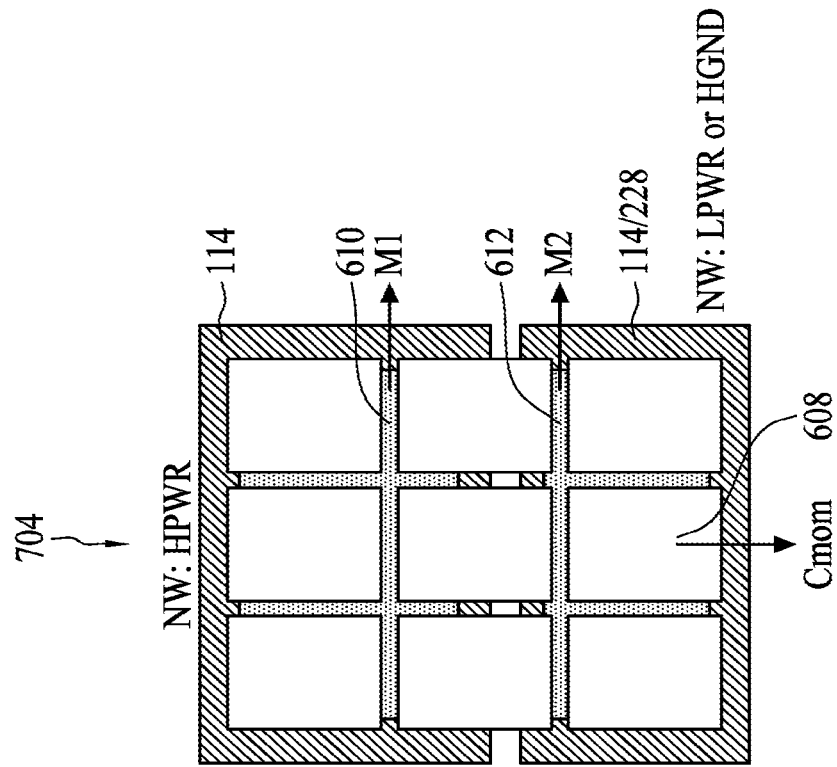
FIG. 7B is an example decoupling capacitor device in accordance with examples of the present application.
Figure 7A:
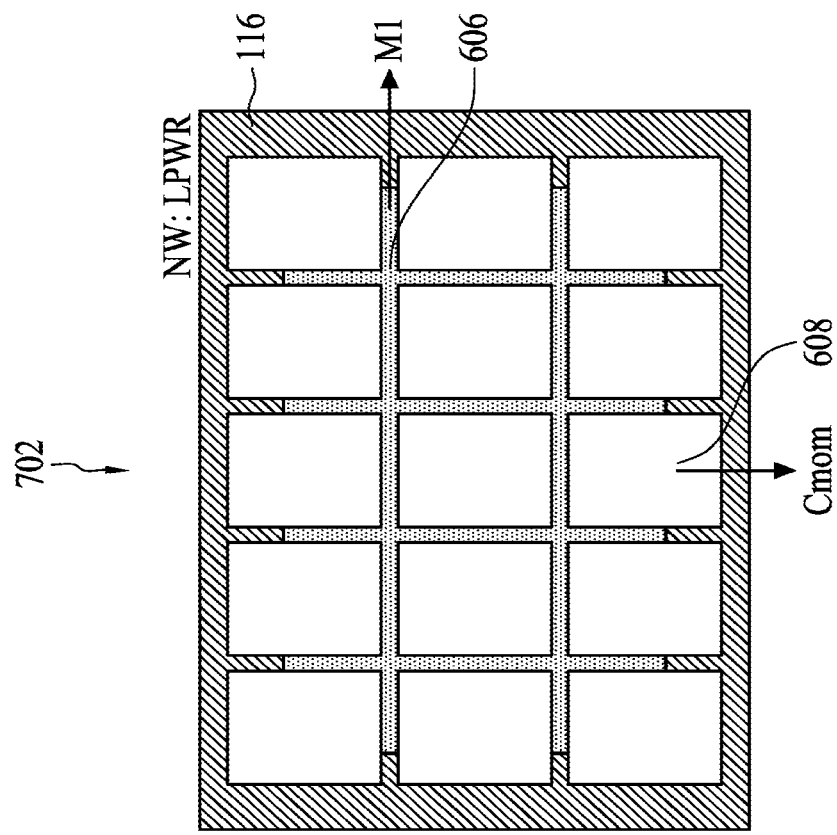
FIG. 7A is an example decoupling capacitor device in accordance with examples of the present application.

An arrangement implementation 702 of the decoupling capacitor 204a, as provided in the semiconductor layout, may be shown in FIG. 7A. The design 702 can include a region of for LWPR 116. The transistor M1 606 may be provided internally as shown in the arrangement 702. The CMOM 608 may then be provided within the areas surround by transistor(s) 606.

An arrangement implementation 704 of the decoupling capacitor 204b, as provided in the semiconductor layout, may be shown in FIG. 7B. In this implementation, transistors 610 and 612 are shown in separate portions of the layout. The HPWR region 114 may be separated from a LPWR region 116/high ground 228. The CMOM 608 may be provided within the area connecting the HPWR region 114 and a LPWR/high ground region 116/228m.

Figure 8:
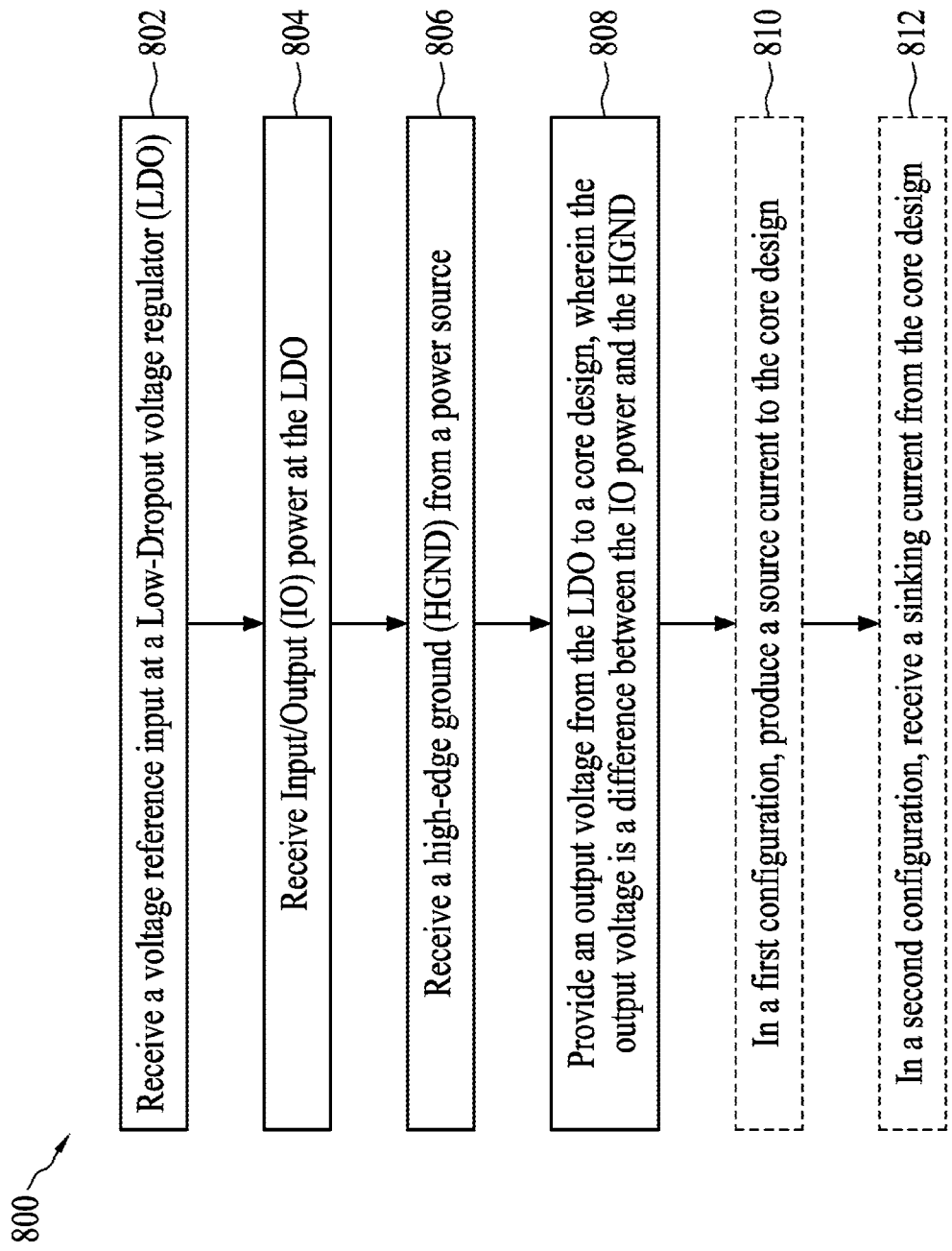
FIG. 8 is a method diagram representing the operation of the LDO in accordance with examples of the present application.

FIG. 8 is a method diagram generally illustrating aspects of an example operation of the LDO, in accordance with aspects of the present disclosure. A general order for the operations of the method 800 is shown in FIG. 8. The method 800 can include more or fewer operations or steps or can arrange the order of the operations or steps differently than those shown in FIG. 8. Hereinafter, the method 800 shall be explained with reference to the systems, components, devices, modules, circuits, etc. described in conjunction with FIGS. 1-7B; however, it will be understood by those of skill in the art that some or all of the operations of method 800 can be performed by or using different elements from those described below.

The LDO 200 receives a voltage reference input 102, in stage 802. The LDO 200 may be configured as described hereinbefore. Thus, an amplifier 202 may receive the voltage reference input 230 from an external input 232 or from a voltage reference generator 206. The voltage reference generator 206 can track a difference between the IO power (HPWR) 114 and a core power 116 to supply the voltage reference input 230 to the amplifier 202 of the LDO 200. To track the difference between the IO power 114 and a core power 116, the voltage reference generator 206 can transform core power information into a current through a core diode-connected Metal-Oxide Semiconductor Field Effect Transistor (MOSFET) 402 and a resistor 406 in series. Then, the voltage reference generator 206 can generate a voltage reference 230 for the amplifier 202 through a second diode-connected MOSFET 408 and a second resistor 414 between the IO power 114 and a voltage reference 422 to the amplifier 202 of the LDO 200.

The LDO 200 can also receive IO power 114, in stage 804. The HPWR 114 may be received as an input to the voltage reference generator 206 or to the decoupling capacitor 204. Thus, the LDO 200 may be operable to supply a voltage reference to the core design 210 even when operating in the high-power domain.

The LDO 200 can also receive HGND 228, from a power source, e.g., the PDCTRL 208, in stage 806. For example, the PDCTRL 208 can supply a high ground signal 228 to the output of the amplifier 202. The presence of the HGND 228 prevents the HPWR input voltage 114 being applied to the core design 210.

The LDO 200 can also provide an output voltage 214 to the core design 210, in stage 808. The output voltage 214 can be determined as a difference between the IO power 114 and the HGND 228. The PDCTRL 208 maintains a high ground in active mode or in power down mode. Thus, the maximum supplied voltage can only be the difference between the HPWR 114 and the HGND 228, which is equivalent to the LPWR signal 116.

The amplifier 202 can be a class-AB folded cascode type amplifier 202d/202e, as described in FIGS. 3A through 3E. The design of the amplifier 202 may allow the LDO 200 to provide a sourcing current 306a, in a first configuration. The LDO 200 can produce a source current 306a to the core design 210 when the core design is drawing power. In other circumstances, the LDO 200 can also receive a sinking current 306b, from the core design 210, when the core design is not drawing power. Whether the LDO 200 receives the sinking current 306b or provides the sourcing current 306a is dependent on the configuration of the core design 210.

The LDO 200 may also include a decoupling capacitor 204. The decoupling capacitor 204 can decouple the HGND 228 from a power source 116/114. Further, the PDCTRL 208 can maintain the HGND 228 in either an active mode or power down mode. With the inclusion of the decoupling capacitor 204 and the HGND 228, the core design 210 is maintained within a SOA regardless of the configuration of the power supply providing power 116/114 to the LDO 200.

Aspects of the present application provide a Low-Dropout voltage regulator (LDO) that includes an amplifier producing a source current to or a sinking current from a load. A Voltage Reference Generator (VREFGEN) circuit is connected to an input of the amplifier to track a fixed voltage reference (VREF) and supply a voltage reference output (VREFM) to the amplifier. A decoupling capacitor is connected to an output of the amplifier to decouple a high-edge ground (HGND) from a power source.

Aspects of the present application further include a level shifter having a Low-Dropout voltage regulator (LDO) with an amplifier producing a source current to or a sinking current from a load. A Voltage Reference Generator (VREFGEN) circuit is connected to an input of the amplifier to track a fixed voltage reference (VREF) and supply a voltage reference output (VREFM) to the amplifier. A decoupling capacitor is connected to an output of the amplifier to decouple a high-edge ground (HGND) from a power source. A Power Down Control Unit (PDCTRL) maintains the HGND in an active mode or a power-down mode.

Aspects of the present application further provide a method including a Low-Dropout voltage regulator (LDO) receiving a voltage reference input. The LDO also receives an Input/Output (IO) power input and a high-edge ground (HGND) input from a power source. The LDO provides an output voltage to a core design. The output voltage is a difference between the IO power and the HGND. In a first configuration, the LDO produces a source current to the core design; and in a second configuration, the LDO receives a sinking current from the core design.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Low-Dropout voltage regulator (LDO) comprising:
   an amplifier supplied with a voltage reference (VREFM), the amplifier configured to produce a source current to or a sinking current from a load;
   a decoupling capacitor, connected to an output of the amplifier, and configured to decouple a high-edge ground (HGND) from a power source; and
   a power down control unit (PDCTRL) configured to maintain the HGND in an active mode of the amplifier and in a power-down mode of the amplifier, wherein the PDCTRL includes a resistor connected at one end of the resistor to a core power voltage through a first switch and connected at another end of the resistor to the output of the amplifier, an input of the amplifier, and at least one diode-connected Metal Oxide Semiconductor Field Effect Transistor (MOSFET) that is coupled to ground through a second switch,
   wherein the at least one diode-connected MOSFET includes two diode-connected MOSFETs connected in series between the output of the amplifier and the second switch.

2. The LDO of claim 1, wherein the at least one diode-connected MOSFET includes a PMOS diode-connected MOSFET.

3. The LDO of claim 1, wherein the at least one diode-connected MOSFET includes an NMOS diode-connected MOSFET.

4. The LDO of claim 1, wherein the decoupling capacitor includes a first capacitor and a second capacitor attached with the load, wherein the first capacitor is a pure Metal-Oxide-Metal (MOM) capacitor (CMOM) connected at one end to the output of the amplifier and at another end to ground, and the second capacitor is a core P-type Metal Oxide Semiconductor Capacitor (PMOSCAP) connected at one end to the output of the amplifier and at another end to the core power voltage or to an Input/Output (IO) power voltage.

5. The LDO of claim 4, wherein one or more MOSFETs is placed beneath the CMOM to get a highest capacitance density.

6. The LDO of claim 1, wherein the amplifier includes a push-pull amplifier that has a push PMOS to the load and a pull NMOS from the load, wherein the push PMOS and the pull NMOS share a drain to connect with the load.

7. The LDO of claim 6, wherein a gate bias of the push PMOS and the pull NMOS is controlled by a single amplifier or a dual amplifier.

8. The LDO of claim 1, comprising a Voltage Reference Generator (VREFGEN) circuit configured to supply the VREFM to the amplifier, the VREFGEN circuit configured to receive a fixed voltage reference and selectively supply the fixed voltage reference to the amplifier as the VREFM.

9. The LDO of claim 1, comprising a VREFGEN circuit configured to supply the VREFM to the amplifier, the VREFGEN circuit configured to transform the core power voltage into a current through a diode-connected MOSFET and a resistor in series and supply a difference between an IO power voltage and the core power voltage, based on the current, to the amplifier as the VREFM.

10. The LDO of claim 1, wherein the VREFM is directly forced by an input voltage or directly forced through the VREFGEN circuit that is configured to transfer a difference between the core power voltage and an IO power voltage.

11. A Low-Dropout voltage regulator (LDO) comprising:
    an amplifier configured to produce a source current to or a sinking current from a load;
    a Voltage Reference Generator (VREFGEN) circuit connected to an input of the amplifier and configured to track a fixed voltage reference (VREF) and supply a voltage reference output (VREFM) to the amplifier;
    a decoupling capacitor, connected to an output of the amplifier and configured to decouple a high-edge ground (HGND) from a power source; and
    a Power Down Control Unit (PDCTRL) configured to maintain the HGND in an active mode of the amplifier and in a power-down mode of the amplifier, wherein the PDCTRL includes a resistor connected at one end of the resistor to a core power voltage through a first switch and connected at another end of the resistor to the output of the amplifier, an input of the amplifier, and at least one diode-connected Metal Oxide Semiconductor Field Effect Transistor (MOSFET) that is coupled to ground through a second switch,
    wherein the at least one diode-connected MOSFET includes two diode-connected MOSFET's connected in series between the output of the amplifier and the second switch.

12. The LDO of claim 11, wherein the at least one diode-connected MOSFET includes a PMOS diode-connected MOSFET.

13. The LDO of claim 11, wherein the at least one diode-connected MOSFET includes an NMOS diode-connected MOSFET.

14. The LDO of claim 11, wherein the VREFGEN circuit is configured to receive the VREF and to determine a difference between the core power voltage and an Input/Output (IO) power voltage to supply the VREFM to the amplifier.

15. The LDO of claim 11, wherein the VREFGEN circuit is configured to transform the core power voltage into a first current that flows through a first diode connected MOSFET and a first resistor in series and configured to generate a second current that corresponds to the first current and flows through a second diode connected MOSFET and a second resistor from an IO power voltage to supply the VREFM to the amplifier.

16. A method comprising:
receiving a voltage reference at an amplifier of a Low-Dropout voltage regulator (LDO);
receiving a core power voltage and an Input/Output (IO) power voltage that is greater than the core power voltage at the LDO;
receiving a high-edge ground (HGND) from a Power Down Control Unit (PDCTRL) of the LDO;
providing an output voltage from the LDO to a core design, wherein the output voltage is a difference between the IO power voltage and the HGND; and
maintaining the HGND in an active mode of the amplifier and in a power-down mode of the amplifier by the PDCTRL that includes a resistor connected at one end of the resistor to the core power voltage through a first switch and connected at another end of the resistor to an output of the amplifier, an input of the amplifier, and at least one diode-connected Metal Oxide Semiconductor Field Effect Transistor (MOSFET) that is coupled to ground through a second switch.

17. The method of claim 16, wherein providing the output voltage comprises:
producing a source current to the core design; and
receiving a sinking current from the core design.

18. The method of claim 16, comprising tracking a difference between the IO power voltage and the core power voltage to supply the voltage reference to the LDO, wherein tracking the difference comprises:
transforming the core power voltage into a first current that flows through a first diode-connected MOSFET and a resistor in series; and
generating a second current that corresponds to the first current and flows through a second diode-connected MOSFET and a second resistor from the IO power voltage to supply the voltage reference to the amplifier.

19. The LDO of claim 11, wherein the amplifier includes a push-pull amplifier that has a push PMOS to the load and a pull NMOS from the load, wherein the push PMOS and the pull NMOS share a drain to connect with the load.

20. The LDO of claim 19, wherein a gate bias of the push PMOS and the pull NMOS is controlled by a single amplifier or a dual amplifier.

* * * * *